(12) United States Patent
Tilleman

(10) Patent No.: US 7,929,585 B2
(45) Date of Patent: Apr. 19, 2011

(54) HIGH BRIGHTNESS SEMICONDUCTOR LASER DIODE ARRAYS

(76) Inventor: Michael M. Tilleman, Arlington, MA (US)

( * ) Notice: Subject to any disclaimer, the term of this patent is extended or adjusted under 35 U.S.C. 154(b) by 77 days.

(21) Appl. No.: 11/940,741

(22) Filed: Nov. 15, 2007

(65) Prior Publication Data

US 2008/0137705 A1 Jun. 12, 2008

Related U.S. Application Data

(60) Provisional application No. 60/859,979, filed on Nov. 20, 2006.

(51) Int. Cl.
*H01S 3/13* (2006.01)
(52) U.S. Cl. ......... 372/29.023; 372/29.02; 372/50.12; 372/21; 372/71; 372/99
(58) Field of Classification Search .......... 372/29.023, 372/29.02, 50.12, 21, 71, 75, 99
See application file for complete search history.

(56) References Cited

U.S. PATENT DOCUMENTS

| | | | |
|---|---|---|---|
| 4,660,205 A * | 4/1987 | Harter et al. | 372/18 |
| 4,757,268 A * | 7/1988 | Abrams et al. | 359/338 |
| 4,813,762 A * | 3/1989 | Leger et al. | 359/565 |
| 5,033,054 A | 7/1991 | Scifres et al. | |
| 5,038,359 A | 8/1991 | Pepper et al. | |
| 5,430,748 A | 7/1995 | MacCormack et al. | |
| 5,592,505 A | 1/1997 | Leger | |
| 5,596,667 A | 1/1997 | Watanabe | |
| 5,832,020 A | 11/1998 | Kong | |
| 6,693,943 B1 | 2/2004 | Holzrichter et al. | |
| 6,700,915 B2 | 3/2004 | Kleinschmidt | |
| 6,885,688 B2 | 4/2005 | Henrichs | |
| 6,920,160 B2 * | 7/2005 | Zeitner et al. | 372/29.023 |
| 7,120,184 B2 | 10/2006 | Holzrichter | |
| 7,286,578 B2 | 10/2007 | Petersen | |

FOREIGN PATENT DOCUMENTS

WO 98/56087 A1 12/1998

OTHER PUBLICATIONS

A. Yariv, Optical Electronics, 3rd Ed., 1985; New York: Holt, Rinehart and Winston, Inc. Chapters 15-16, pp. 467-496, 499-525.
J. T. Verdeyen, Laser Electronics, 2nd Ed. 1989, Englewood Cliffs, New Jersey: Prentice-Hall, Inc., Chapter 11, pp. 361-411.
W. J. Smith, Modern Optical Engineering: The Design of Optical Systems, 2nd Ed. 1990, New York: McGraw-Hill, Inc., pp. 142-145.
T. Y. Fan, Laser Beam Combining for High-Power, High-Radiance Sources, IEEE J. of Selected Topics in Quantum Electronics, vol. 11, No. 3, May/Jun. 2005, pp. 567-577.
C. J. Corcoran et al., Modal analysis of a self-Fourier laser cavity, J. Opt. A: Pure Appl. Opt. 7 (2005) L1-L7.
C. J. Corcoran et al., Self-Fourier functions and coherent laser combination, J. Phys. A: Math. Gen. 37 (2004), L461-L469.

(Continued)

*Primary Examiner* — Kinam Park
(74) *Attorney, Agent, or Firm* — Burns & Levinson LLP; Orlando Lopez

(57) ABSTRACT

Systems and methods for high brightness, improved phase characteristics laser diodes.

26 Claims, 7 Drawing Sheets

OTHER PUBLICATIONS

O. Bryngdahl, Image formation using self-imaging techniques, J. Opt.Soc. Amer., vol. 63, No. 4, pp. 416-419, 1973.

L. B. Soldano et al., Optical multi-mode interference devices based on self-imaging: principles and applications, Journal of Lightwave Technology, vol. 13, Issue 4, Apr. 1995 pp. 615-627.

Y. Kono et al. A Coherent All-Solid-State Laser Array Using the Talbot Effect in a Three-Mirror Cavity. IEEE J. of Quantum Electronics, vol. 36, No. 5, May 2000, 607-614.

International Search Report dated May 8, 2008 for PCT/US07/84908 filed Nov. 16, 2007. Applicant: Michael M. Tilleman.

* cited by examiner

HIGH BRIGHTNESS SEMICONDUCTOR LASER DIODE ARRAYS

CROSS REFERENCE TO RELATED APPLICATIONS

This application claims priority of U.S. Provisional Application Ser. No. 60/859,979, entitled HIGH BRIGHTNESS, COHERENT, SEMICONDUCTOR LASER DIODE ARRAY, filed on Nov. 20, 2006, which is incorporated by reference herein.

BACKGROUND

The present teachings are in the general field of semiconductor lasers. To extract high power and high energy magnitudes from semiconductor laser diodes, stripes of single emitting junctions are configured in monolithic planar arrays, then in monolithic bars that are further stacked horizontally and vertically thus forming two-dimensional arrays. Though each individual emitter outputs a beam of good optical quality, the multiple stripes are predominantly out of phase with one another and their combination results therefore in an optical beam of poor quality and low brightness. In order to generate laser beams with high optical quality and brightness the state-of-the-art practice is to use laser diode arrays for pumping solid state lasers which in turn produce highly bright beams. Disadvantages of this method include loss factors in converting the lasers diode emission to solid-state laser due to quantum defect, imperfect optical coupling as well as the additional cost and complexity involving the incorporation of a solid-state laser to the system.

BRIEF SUMMARY

In one embodiment, the system of these teachings includes a laser diode having an array of semiconductor active regions disposed between two at least partially transmissive facets, an optical subsystem optically disposed to receive electromagnetic radiation emitted from one of the two at least partially transmissive facets, and a phase conjugating reflective component optically disposed to receive electromagnetic radiation from the optical subsystem. In other embodiments, the system of these teachings includes a beam combining component and/or a frequency selective component.

Systems applying embodiments of the system of these teachings to pump a laser gain medium or an optically active medium capable of harmonic generation or parametric amplification are also within the scope of these teachings.

Embodiments of the method of these teachings are also disclosed.

For a better understanding of the present teachings, together with other and further needs thereof, reference is made to the accompanying drawings and detailed description and its scope will be pointed out in the appended claims.

DETAILED DESCRIPTION

Figure 1:
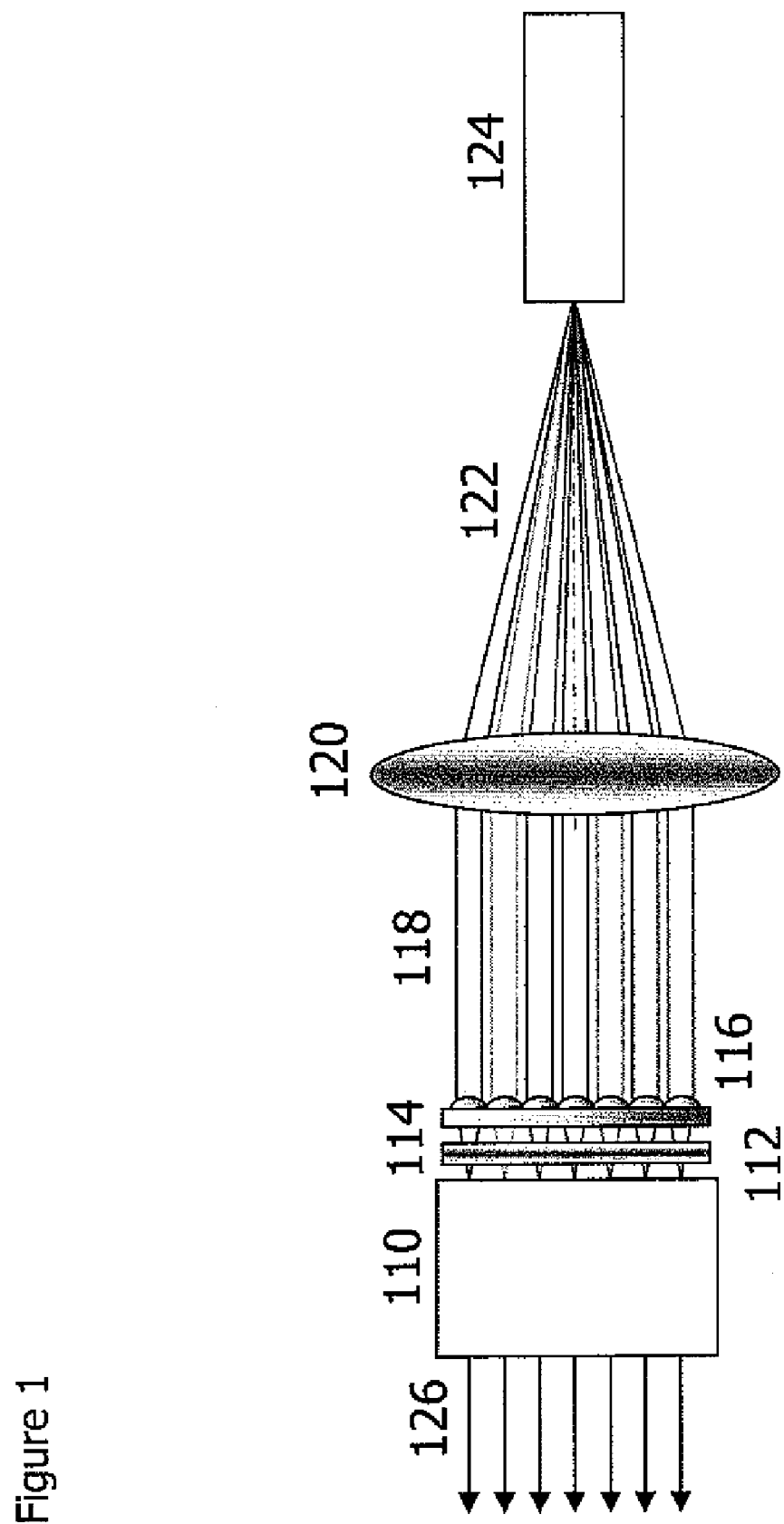
FIG. 1 is a schematic representation of one embodiment of the system of these teachings.

Various concepts of optics and lasers referred to in this application are conventional in, for example, optics, optical electronics and laser technology, and thus they need not be described in detail herein. These concepts include, without limitation, phase conjugate optics, semiconductor laser active regions, optical fast and optical slow, and can be found in several publications including, but not limited to, the following: Yariv, *Optical Electronics*, ISBN 0-03-070289-5, chapters 15-16; J. T. Verdeyen, *Laser Electronics*, ISBN 0-13-523630-4, chapter 11; and Smith, *Optical Engineering*, ISBN 0-07-059174-1, pp. 142-145; which are incorporated by reference herein.

In one embodiment, the system of these teachings includes a laser diode having an array of semiconductor active regions (the active regions are also referred to as "gain regions" or "gain stripes" and the array of active regions is also referred to as a "multi-stripe gain medium") disposed between two at least partially transmissive facets, an optical subsystem optically disposed to receive electromagnetic radiation emitted from one of the two at least partially transmissive facets, and a phase conjugating reflective component optically disposed to receive electromagnetic radiation from the optical subsystem. In one embodiment, the electromagnetic radiation is partially coherent. The optical subsystem images the electromagnetic radiation emitted from the one partially transmissive facet onto the phase conjugating reflective component. The phase conjugating reflective component provides phase conjugated reflected electromagnetic radiation to the optical subsystem. The optical subsystem provides at least a portion of the phase conjugated reflected electromagnetic radiation to the laser diode. Electromagnetic radiation resulting from propagation of at least a portion of the electromagnetic radiation, provided by the optical subsystem to the laser diode, through the array of semiconductor active regions is emitted by another facet from the two at least partially transmissive facets.

In another embodiment, the embodiment described hereinabove also includes a beam combining component optically disposed to receive the at least a portion of electromagnetic radiation emitted by the other facet and capable of coherently combining beams from said at least a portion of electromagnetic radiation emitted by the other facet.

In one instance, the optical subsystem, in the embodiment described hereinabove, includes a group of optical components capable of collimating beams from the electromagnetic radiation emitted from the one of the two partially transmissive facets and another group of optical components capable of imaging the collimated beams onto the phase conjugating reflective component.

In another instance, the optical subsystem described hereinabove also includes a frequency selecting component, such as, but not limited to, a Fabry Perot etalon or a diffraction grating, the transmission of electromagnetic radiation through the frequency selecting component has a substantially relative maximum at a number of predetermined frequencies. The frequency selecting component is optically disposed to receive collimated beams from the first group of optical components and to provide electromagnetic radiation to the other group of optical components. In some instances, including a frequency selecting component can narrow the laser spectral line and result in increased laser coherence length.

One embodiment of the system of these teachings is shown in FIG. 1. Referring to FIG. 1, a conventional laser diode array 110 including a semiconductor multi-stripe gain medium and two at least partially transmissive facets 109, 111, and optical subsystem (comprised, in the embodiment shown but not a limitation of these teachings, of two groups of components, collimating components 112, 114 and imaging component 120) and a phase conjugating reflective component 124. From one facet 111 of the multi-stripe gain medium in the laser diode array 110, multiple beams 112 are emitted expanding in both the fast and slow axis planes. In the embodiment shown, in the first group of optical elements, a cylindrical lens 114 slows the expansion of the beams in the fast-axis plane (perpendicular to the page) and a lenslet array 116 collimates the beams in the slow-axis plane. The collimated beams 118 are imaged (in the embodiment shown in FIG. 1, the beams are focused, but it should be noted that this is not a limitation of these teachings) by an imaging (focusing in the embodiment shown in FIG. 1) group of optical elements 120. In one instance, not a limitation of these teachings, the lenslet array 114 and the group of optical elements (a focusing lens in the embodiment shown in FIG. 1) 120 form a telecentric optical sub system in which the electromagnetic radiation emitted from individual laser stripe through the one facet 111 are imaged to a substantially single image coupled to the reflective phase conjugating component 124. In the embodiment shown in FIG. 1, the f-number of the imaging component 120 is substantially equal to half the inverse of the numerical aperture (NA) of the phase conjugating component 124. (In most embodiments, the imaging component 120 is adapted to substantially optimally couple electromagnetic radiation to the reflective phase conjugating component 124.) In the embodiment shown in FIG. 1, the beam set 122 is image (focused, in the embodiment shown) on the reflective phase conjugating component 124 reflecting the conjugate beam. On completing a round trip in the laser resonator the beams attain a substantially corrected uniform phase at the other facet 109 of the diode array 110 where the output beams 126 are outcoupled.

Exemplary embodiments of the reflective phase conjugating component 124 include, but are not limited to, a two-wave mixing, stimulated Brillouin scattering (SBS) component, a two-wave mixing, stimulated Raman scattering component, a two-wave mixing, photorefractive component, a four-wave mixing, stimulated Brillouin component, a four-wave mixing, stimulated Raman scattering component, a four-wave mixing, photorefractive component and a phase conjugating reflective diffractive element, such as, but not limited to, that disclosed in U.S. Pat. No. 5,592,505, which is incorporated by reference herein in its entirety.

In some embodiments of the phase conjugation component, consideration should be given to spectral content. Additionally, some embodiments of the phase conjugation component, such as components based on SBS and SRS processes, impart a spectral shift to the incident electromagnetic radiation. Design considerations, for example, such as the preceding considerations as well as ensuring that the phase conjugated reflection remains within the spectral range covered by the gain envelope of the semiconductor gain medium, are taken into account in embodiments of these teachings.

In another embodiment, the reflective phase conjugating component 124 includes an optical fiber having a length that at the least substantially equals the length required for effective reflection. Such optical fiber is, in one instance, of the multimode type with NA such that the selected focusing optical component 120 has an f-number substantially equal to 1/(2 NA). For example, these teachings not being limited to only this example, a typical multimode fused silica fiber having NA of about 0.2 determines the use of a focusing lens with f-number of about 2.5.

In many embodiments, the intensity of the incident electromagnetic radiation should exceed the threshold intensity of the reflective phase conjugating component, and the reflection coefficient of the reflective phase conjugating component is a function of the incident intensity. In many embodiments, the intracavity gain exceeds the losses. In one instance, in the two-wave process embodiment, the distal end of the reflective phase conjugating component is reflective at the laser wavelength, thus providing feedback for uncorrected mode of operation in the period in which the reflective phase conjugating component feedback builds up. In another instance, in the four-wave processes embodiment, an external laser or lasers are used to pump the reflective phase conjugating component 124 and, as a result of the four-wave-mixing, the threshold intensity is lowered and the reflection coefficient may, in some instances, exceed unity.

In one embodiment, the reflective phase conjugating component 124 is realized in fused silica by the use of an optical fiber. In an exemplary embodiment, these teachings not being limited to only that exemplary embodiment, in a fiber with a core diameter of about 25 μm, a two-wave SBS process the gain factor in fiber-glass is about 25 cm/GW and an incident-circulating laser power of about 1 W. For a threshold value of about 40, a fiber length of about 80 m is required for good reflection. For an exemplary embodiment (not a limitation these teachings) where a high power laser diode array emitting about 100 W is corrected, for a circulating power of about 200 W intracavity, a fiber length of about 80 m is required for a fiber with a core diameter of about 300 μm. In another exemplary embodiment, the reflective phase conjugating component 124 is realized in liquid carbon disulphide filling a tube with an inner diameter of about 100 μm. For a two-wave SBS process the gain factor in $CS_2$ is about 150 cm/GW and a circulating power of about 200 W and a threshold value of about 40, a tube length of about 1 m is required. It should be noted that this exemplary embodiments are not limitations of these teachings.

Figure 2:
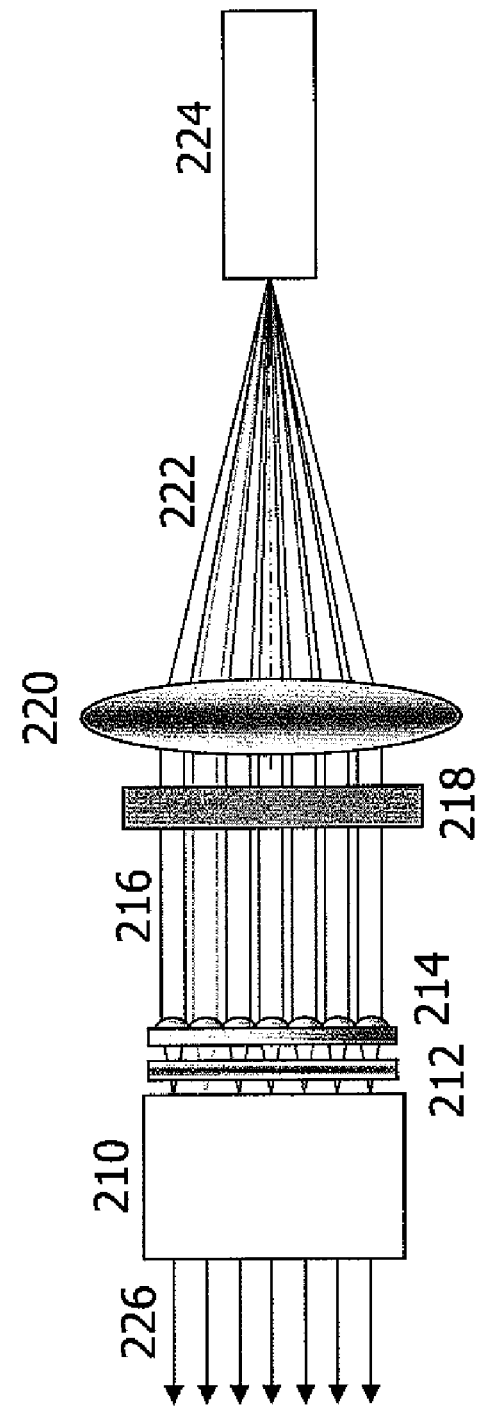
FIG. 2 is a schematic representation of another embodiment of the system of these teachings.

Another embodiment of the system of these teachings is shown in FIG. 2. Referring to FIG. 2, a conventional laser diode array 210 including a semiconductor multi-stripe gain medium and two at least partially transmissive facets 209, 211, and optical subsystem (comprised, in the embodiment shown but not a limitation of these teachings, of two groups of components, collimating components 212, 214 and imaging component 220 and a frequency selective component 218) and a phase conjugating reflective component 224. From one facet 211 of the multi-stripe gain medium in the laser diode array 210, multiple beams 112 are emitted expanding in both the fast and slow axis planes. In the embodiment shown, in the first group of optical elements, a cylindrical lens 212 slows the expansion of the beams in the fast-axis plane (perpendicular to the page) and a lenslet array 214 collimates the beams in the slow-axis plane. The collimated beams 216 are incident on the frequency selecting component 218. Transmission of electromagnetic radiation through the frequency selecting component 218 have a substantially relative maximum at a number of predetermined frequencies. In one embodiment, not a limitation of these teachings, the frequency selecting component 218 is a Fabry Perot etalon or a diffraction grating. The beams emanating from the frequency selecting component 218 are imaged (in the embodiment shown in FIG. 2, the beams are focused, but it should be noted that this is not a limitation of these teachings) by an imaging (focusing in the embodiment shown in FIG. 2) group of optical elements 220. In the embodiment shown in FIG. 2, the f-number of the imaging component 120 is substantially equal to half the inverse of the numerical aperture (NA) of the phase conjugating component 224. (In most embodiments, the imaging component 220 is adapted to substantially optimally couple electromagnetic radiation to the reflective phase conjugating component 224.) In the embodiment shown in FIG. 2, the beam set 222 is imaged (focused, in the embodiment shown) on the reflective phase conjugating component 224, reflecting the conjugate beam. The beams 222, after reflection from the reflective phase conjugating component 224, retrace the path and are provided by the optical subsystem 220, 218, 214, 212 to the facet 211 of the laser diode array 210, propagates through the multi-stripe gain medium and are emitted from the other facet 209. After propagating through the multi-stripe gain medium and a mission from the other facet 209, beams attain a substantially corrected uniform phase at the other facet 209 of the diode array 210 where the output beams 226 are outcoupled. In one instance, the embodiment shown in FIG. 2, which includes the frequency selective component 218, results in substantially a single longitudinal mode of the laser diode being selected.

Embodiments, these teachings not being limited to only those embodiments, of the frequency selective component 218 include a Fabry-Perot etalon and a spectral grating of either refractive of reflective type. In an exemplary embodiment, not a limitation of these teachings, the Fabry-Perot etalon is a quartz plate with planar parallel surfaces having a thickness of about 0.1 mm and a finesse value of about 100. This exemplary embodiment results in a separation between longitudinal modes of about 1 THz corresponding to about 3.4 nm in wavelength domain at 1 µm, and the FWHM of the spectral line becomes about 10 GHz corresponding to about 34 pm in wavelength domain at 1 µm. In contrast, combinational high-power laser diode-arrays without frequency selection emit beams with spectral widths a few nanometers in wavelength domain. Further spectral narrowing is obtainable by utilizing another, thicker etalon in the embodiment of the frequency selective component 218. In the exemplary embodiment in which the etalon thickness is about 2 mm, having a finesse of about 100, the spectral line will be narrowed to about 0.5 GHz corresponding to about 1.7 pm in wavelength domain at 1 µm. The corresponding coherence length to the preceding exemplary embodiment is 60 cm. it should be noted that this exemplary embodiment is presented in order to better elucidate these teachings and does not limit the present teachings.

Figure 3:
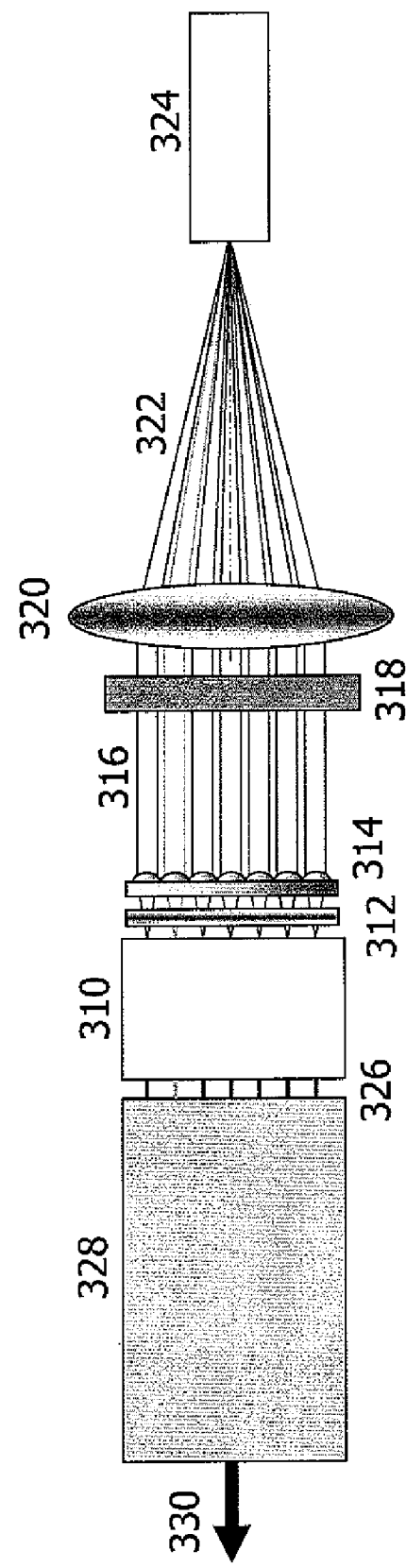
FIG. 3 is a schematic representation of yet another embodiment of the system of these teachings

Yet another embodiment of the system of these teachings presented in FIG. 3. Referring to FIG. 3, a conventional laser diode array 310 including a semiconductor multi-stripe gain medium and two at least partially transmissive facets 309, 311, and optical subsystem (comprised, in the embodiment shown but not a limitation of these teachings, of two groups of components, collimating components 312, 314 and imaging component 320 and frequency selecting components 318) and a phase conjugating reflective component 324. From one facet 311 of the multi-stripe gain medium in the laser diode array 310, multiple beams 312 are emitted expanding in both the fast and slow axis planes. In the embodiment shown, in the first group of optical elements, a cylindrical lens 312 slows the expansion of the beams in the fast-axis plane (perpendicular to the page) and a lenslet array 314 collimates the beams in the slow-axis plane. The collimated beams 316 are incident on the frequency selecting component 318. Transmission of electromagnetic radiation through the frequency selecting component 318 have a substantially relative maximum at a number of predetermined frequencies. In one embodiment, not a limitation of these teachings, the frequency selecting component 218 is a Fabry Perot etalon or a diffraction grating. The beams emanating from the frequency selecting component 318 are imaged (in the embodiment shown in FIG. 3, the beams are focused, but it should be noted that this is not a limitation of these teachings) by an imaging (focusing in the embodiment shown in FIG. 3) group of optical elements 320. In the embodiment shown in FIG. 3, the f-number of the imaging component 320 is substantially equal to half the inverse of the numerical aperture (NA) of the phase conjugating component 324. (In most embodiments, the imaging component 320 is adapted to substantially optimally couple electromagnetic radiation to the reflective phase conjugating component 324.) In the embodiment shown in FIG. 3, the beam set 322 is imaged (focused, in the embodiment shown) on the reflective phase conjugating component 324, reflecting the conjugated beam. The beams 322, after reflection from the reflective phase conjugating component 324, retrace the path and are provided by the optical subsystem 320, 318, 314, 312 to the facet 311 of the laser diode array 310, propagate through the multi-stripe gain medium and are emitted from the other facet 309. After propagating through the multi-stripe gain medium and emission from the other facet 309, the beams attain a substantially corrected uniform phase at the other facet 309 of the diode array 310 where the output beams 326 are emitted. The output beams 326 are provided to a beam combining component 328. The beam combining component substantially coherently combines the beams 326, producing an output beam 330, which is substantially coherent.

In one embodiment, these teachings not being limited to only that embodiment, the beam combining component 328 is a Talbot cell (also referred to as a Talbot cavity).

It should be noted that the methods and systems of these teachings can be practiced in conjunction with other methods and systems for combining laser diode beams. Methods for coherently combining laser diode beams, such as those detailed in T. Y. Fan, *Laser Beam Combining in High Power, High Radiance Sources*, IEEE J. of Selected Topics in Quantum Electronics, Vol. 11, No. 3, May/June 2005, pp. 567-577, incorporated by reference herein in its entirety, are within the scope of these teachings.

External cavities have been used in conjunction with laser arrays in order to coherently couple the individual lasers in the array, that is, form a phased array (see, for example, C J Corcoran and K A Pasch, Modal analysis of a self-Fourier laser Cavity, J. Opt. A: Pure Appl. Opt. 7 (2005) L1-L7 and C J Corcoran and K A Pasch, Self-Fourier functions and coherent laser combination, J. Phys. A: Math. Gen. 37 (2004), L461-L469, both which are incorporated by reference herein in their entirety).

One embodiment of a phased array is a Talbot resonator (see, for example, Uwe Braurch, Peter Looosen, and Hans Opower, High-Power Diode Lasers for Direct Applications, in High-Power Diode Lasers, R. Diehl, Editor, Springer (2000), which is incorporated by reference herein). A Talbot cavity (an embodiment of a combining component) is an optical resonator cavity. While not desiring to be bound by theory, in a Talbot cavity (cell), optical waves introduced at an object or objects plane interfere among themselves and with their reflections off the cell walls such that at nodal points the interference becomes constructive if the object waves are in phase and destructive if they are out of phase. The constructive interference forms an image or images of the objects at said nodal points which per a specific geometry and medium are located. (See, for example, O. Bryngdahl, "Image formation using self-imaging techniques," *J. Opt. Soc. Amer.*, vol. 63, no. 4, pp. 41-19, 1973, incorporated by reference herein in its entirety.) It should be noted that although the exemplary embodiments are presented below for a Talbot cavity, other external cavity embodiments forming a phased array are within the scope of these teachings.

In one embodiment, these teachings not being limited to only that embodiment, the Talbot cell is implemented by means of a Multi-Mode Interference (MMI) device. (For MMI devices, see, for example, Soldano, L. B., Pennings, E. C. M, *Optical multi-mode interference devices based on self-imaging: principles and applications*, Journal of Lightwave Technology, Volume 13, Issue 4, April 1995 Page(s): 615-627, incorporated by reference herein.) In one instance, the MMI device is realized in an optical waveguide structure. The MMI device, while not designed to be bound by theory, can be described as operating on the principle of multiple images obtained in a multimode waveguide of a certain length. For instance, in an exemplary embodiment, not a limitation of these teachings, an object is N-fold imaged in an MMI having a length:

$$L = \frac{p}{N}\left(\frac{3L_\pi}{4}\right) \text{ with } p = 0, 1, 2, \ldots \quad (1)$$

where: $3L_\pi$ is the distance required for self imaging and p denotes the periodic nature of the imaging along the multimode waveguide. The self image $3L_\pi$ also referred to as Talbot distance is defined as:

$$z_T = 3L_\pi = \frac{2d^2}{\lambda} \quad (2)$$

where d is the center-to-center spacing of the semiconductor gain channels and $\lambda$ is the laser wavelength. In accordance with the principle of reciprocity just as a single object can be N-fold imaged thus also on the reciprocal path can an N-fold object be transformed into a single image, provided the objects are in phase. In these teachings, the N-outcoupled objects, the output beams 326, are substantially in phase, therefore the single image intensity of the output beams 326 is the coherent sum of the individual object intensities. An illustrative embodiment, not a limitation of these teachings, is presented hereinbelow in order to elucidate the present teachings. In one example, to estimate the size of an MMI in which 4 stripes are spaced by 30 μm and have gain at the wavelength of 980 nm being singly imaged. The resulting Talbot distance, in that example, is 1.84 mm and the distance to obtain a single image L (for p=1) is 115 μm. In another exemplary embodiment, a number of single images, such as described herein above, are further relayed to the formation of a single image thereof. This embodiment includes the side-by-side placement of 4 of the first MMIs and produces a single image after a distance of 2×115 μm. In another embodiment, another parallel cascade results in a single image out of N=64 channels after a distance of 3×115 μm. In still another embodiment, further cascading leads to a single image out of object $N=4^n$ channels after a distance of n×115 μm. It should be noted that a full MMI cascaded complex can be realized on a single semiconductor chip.

In a further embodiment, the output of the beam combining component 328 (in one instance, but not a limitation of these teachings, an MMI) is coupled to a single-mode fiber. In an exemplary embodiment, these teachings not being limited to only the exemplary embodiment, the single mode fiber has a core diameter of about 20 μm. In that embodiment, for an output power of about 100 W the peak intensity in the fiber is about 32 MW/cm$^2$, which is well below the damage threshold of 10 GW/cm$^2$ estimated in glass and 1 GW/cm$^2$ estimated in dielectric coatings. In one instance, in order to mitigate back reflection from the fiber facet to the Beam combining component and in turn to the laser diode, the fiber is preferably cleaved at an angle of substantially minimum reflection in the incident angle. In one exemplary embodiment, not a limitation of these teachings, a laser, with the corrected phase, has a brightness estimated at about 4 GW/cm$^2$/sr whereas the brightness of the uncorrected laser diode array is typically about 10 MW/cm$^2$/sr. Embodiments in which the substantially single beam output 330 has a brightness of more than 100 times the brightness of the uncorrected laser diode array 310 are within the scope of this teachings.

Figure 4A:
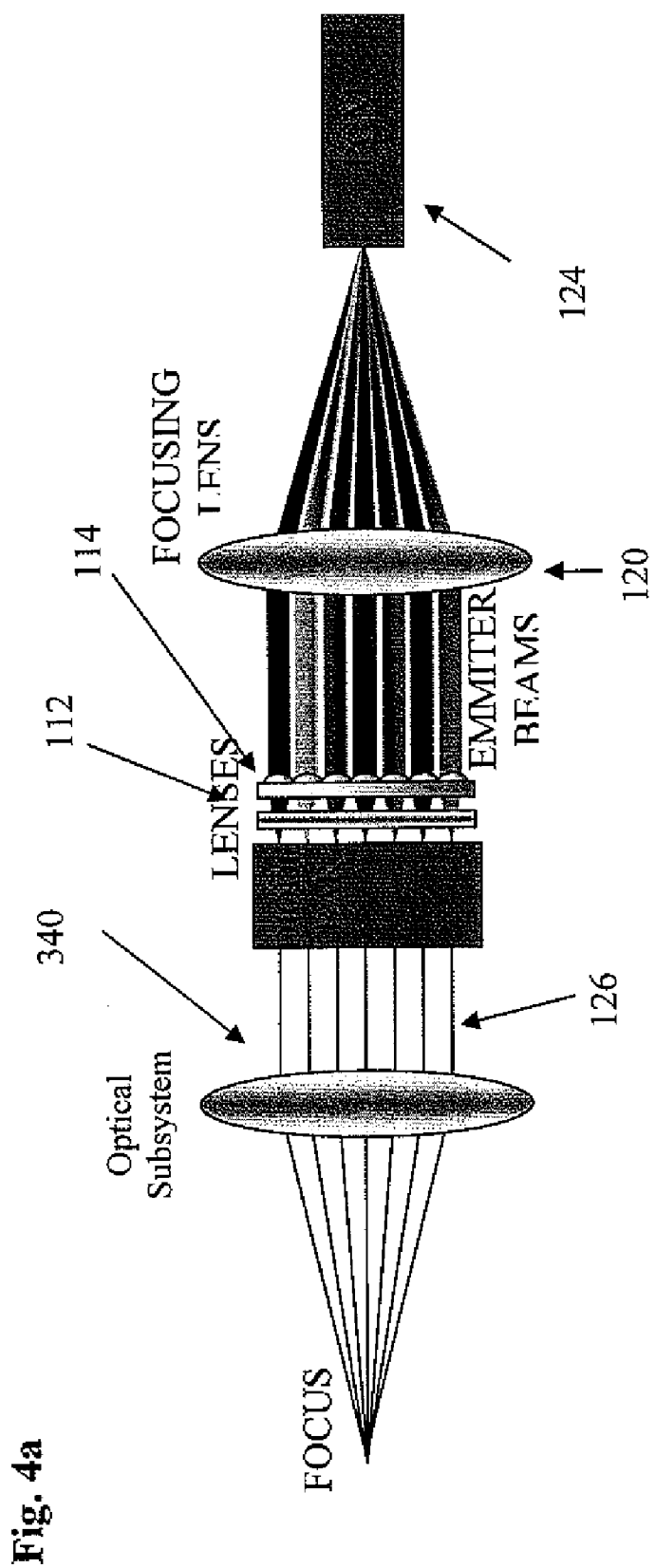
FIGS. 4a, 4b are schematic representations of further embodiments of the system of these teachings

A further embodiment of the system of these teachings is shown in FIG. 4a. Referring to FIG. 4a, the embodiment shown therein includes the embodiment shown in FIG. 1 (similar elements having the same reference number) and an optical subsystem 340 (although a focusing lens is shown in FIG. 4a, it should be noted that these teachings are not limited to only a focusing lens and various other embodiments of the optical subsystem are disclosed hereinbelow) capable of receiving the substantially output beams 126 of electromagnetic radiation and of emitting beams of electromagnetic radiation.

Figure 4B:
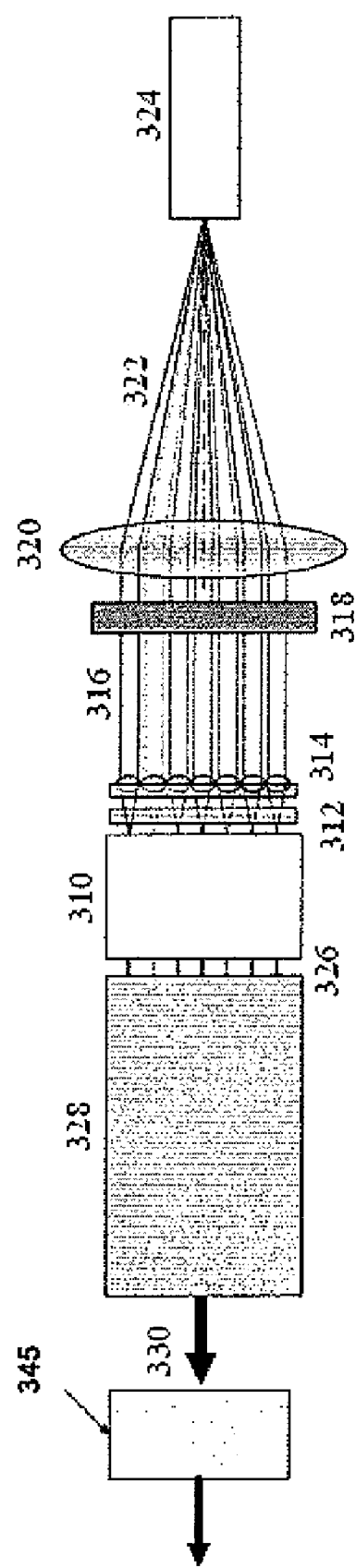

A further embodiment of the system of these teachings is shown in FIG. 4b. Referring to FIG. 4b, the embodiment shown therein includes the embodiment shown in FIG. 3 (similar elements having the same reference number) and another optical subsystem 345 capable of receiving the substantially single beam 330 of electromagnetic radiation and of emitting a beam of electromagnetic radiation. In one instance, the other optical subsystem 345 is capable of focusing the substantially single beam 330 to a spot at most 3 times the size of a diffraction limited spot. In another instance, the other optical subsystem 345 is adapted to provide the substantially single beam 330 to an optical fiber. In a particular instance, the optical fiber is a single mode optical fiber. In yet another instance, the other optical subsystem 345 includes at least one optical element, and the optical elements can be reflective optical elements or refractive optical elements (GRIN rod lenses are included among refractive optical elements). The other optical subsystem 345 can be utilized to image the substantially single beam 330 from an input to the other optical subsystem 345 to a location at an output imaging plane of the other optical subsystem 345 (also referred to as propagating to substantially single beam 330). It should be noted that although several applications of the other optical subsystem 345 have been disclosed herein above, other applications also within the scope of these teachings.

Figure 5:
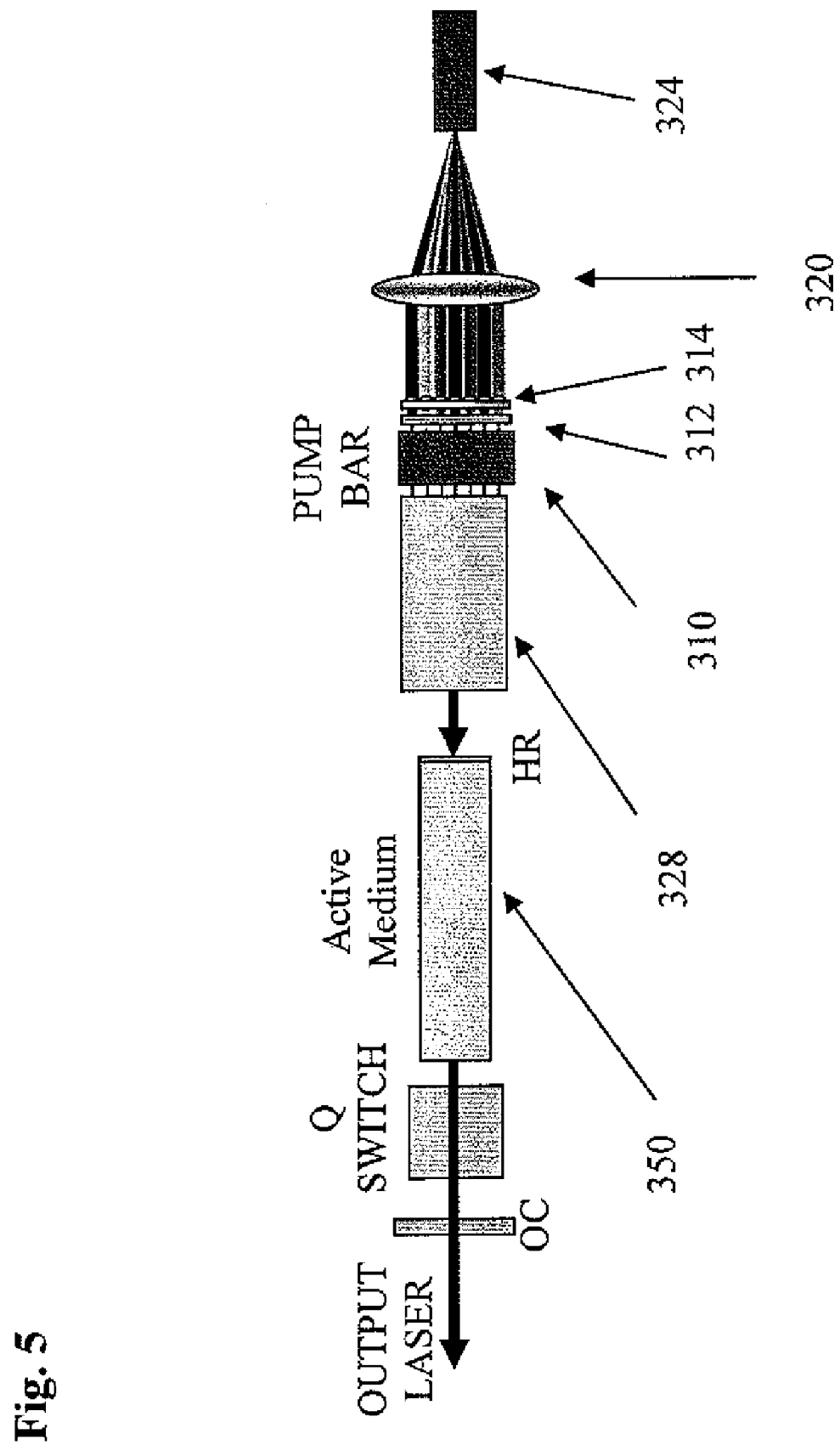
FIG. 5 is a schematic representation of yet a further embodiment of the system of these teachings.

FIG. 5 depicts yet a further embodiment of the system of these teachings. Referring to FIG. 5, the embodiment shown therein includes the embodiment shown in FIG. 3 (similar elements having the same reference number) and also includes an active medium 350. ("Active medium" as used herein refers to an optically active medium such as a laser gain medium, an optical medium capable of parametric amplification or an optical medium capable of harmonic generation.) In the embodiment shown in FIG. 5, the active medium 350 is a laser gain medium and the substantially single beam 330 is utilized to provide electromagnetic radiation to the active medium (laser gain medium) 350. The group of components producing the substantially single beam 330 (the laser diode array 310, the optical subsystem 312, 314, 320, the phase conjugating reflective optical component 324 and the beam combining component 328) constitutes an optical pumping component. In one embodiment (as shown in FIG. 3), the optical pumping component can also include a frequency selective component (318, FIG. 3). Also shown in FIG. 5 are in a Q switch and the output portion of a resonator, which are components typically used in conventional lasers. Although the embodiment shown in FIG. 5 depicts end pumping of the laser gain medium 350, it should be noted that this is not a limitation of this teachings and other pumping configurations also within the scope of this teachings.

Exemplary embodiments, these teachings not being limited to only these exemplary embodiments, of laser gain medium being pumped by an optical pumping component of this teachings include, for example, but not limited to, systems in which the laser diode array emits at 808 nm and the substantially single beam 330 is utilized to pump Nd on the $^2H_{9/2}$ and $^4F_{5/2}$ state, embodiments in which the laser diode array emits at 885 nm and the substantially single beam 330 is utilized to pump Nd on the $^4F_{3/2}$ state ($R_2$ or $R_1$-resonant) to embodiments in which the laser diode array emits at 480 and the substantially single beam 330 is utilized to pump Pr on the $^3P_0$ state. It should be noted that the above exemplary embodiments are only presented to illustrate these teachings and these teachings are not limited to only those embodiments.

In embodiments use with the active medium is capable of harmonic generation or parametric amplification, the coherence length of the embodiments of the system of these teachings enables substantially efficient harmonic generation or parametric amplification.

During operation, embodiments of the system of this teachings can be utilized to improve phase characteristics (such as, but not limited to, phase uniformity) of multiple beams emitted from one facet of a laser diode by imaging the multiple beams onto a phase conjugating reflective component, obtaining reflected phase conjugated electromagnetic radiation from the phase conjugating reflective component, providing the reflected phase conjugated electromagnetic radiation to the one facet of the laser diode; the laser diode comprising an array of semiconductor active regions disposed between the one facet and another facet, propagating at least a portion of the provided reflected phase conjugated electromagnetic radiation through the array of semiconductor active regions to the other facet and emitting, from the other facet, electromagnetic radiation resulting from the propagated at least a portion of the provided reflected phase conjugated electromagnetic radiation through the array of semiconductor active regions. In one instance, the above described embodiment of the method of these teachings also includes selecting a substantially a single longitudinal mode from the multiple beams emitted from the one facet.

Figure 6:
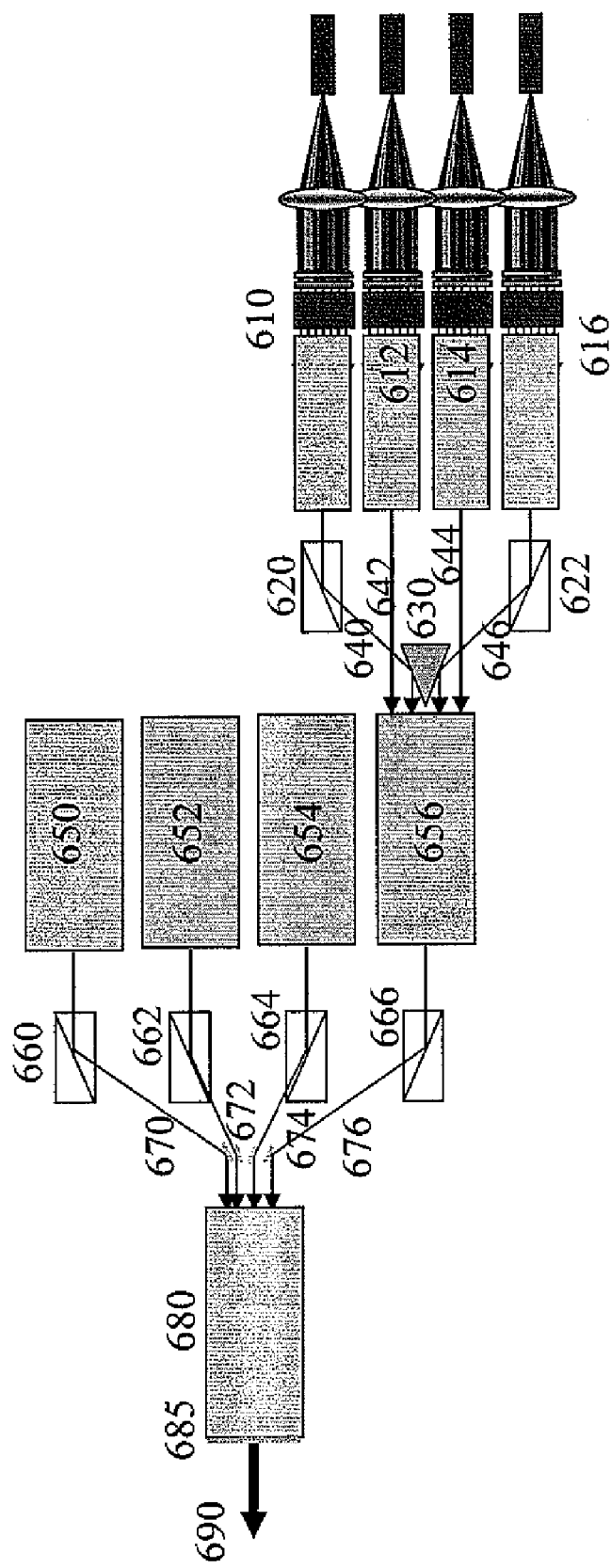
FIG. 6 is a schematic representation of still a further embodiment of the system of these teachings

Another embodiment of the system of these teachings is shown in FIG. 6. Referring to FIG. 6, the embodiment shown therein includes two or more coherently combining subsystems 610, 612, 614 and 616, each coherently combining subsystem including the components of the subsystem shown in FIG. 3: a conventional laser diode array 310 including a semiconductor multi-stripe gain medium and two at least partially transmissive facets 309, 311, an optical subsystem (comprised, in the embodiment shown but not a limitation of these teachings, of two groups of components, collimating components 312, 314 and imaging component 320 and frequency selecting components 318), a phase conjugating reflective component 324 and a beam combining component 328. The electromagnetic radiation emitted by the beam combining component in each of two of the coherently combining subsystems 612, 614 is provided directly to another beam combining subsystem 656. The electromagnetic radiation emitted by the beam combining component in another one of the coherently combining subsystems 610 is provided to an optical deflecting component 620. The electromagnetic radiation emitted by the beam combining component in yet another one of the coherently combining subsystems 616 is provided to another optical deflecting component 622. Each of the beam deflecting components 620, 622 (a prism in the embodiment shown) deflects the provided electromagnetic radiation to a predetermined location (one predetermined location for the beam deflecting component 620 and another predetermined location for the beam deflecting component 622). Another beam deflecting component 630 (a mirror in the embodiment shown) receives the electromagnetic radiation deflected from the beam deflecting components 620, 622 and redirects the received radiation in order to provide the received radiation to the other beam combining component 656. It should be noted that the sub system can be replicated and still other beam deflecting components 654, 652, 650 can receive electromagnetic radiation from other groups of coherently combining subsystems and that, subsequently, the output of the first beam combining component 656 and the other beam combining components 650, 652, 654 can be combined and provided to a final beam combining component 680. In one instance, an outcoupling mirror 685 receives the electromagnetic radiation from the final beam combining component 680. (In one instance, not a limitation of these teachings, the beam combining components are Talbot cavities, also referred to as Talbot cells.)

During operation, embodiments of the system of this teachings can be utilized to coherently combine multiple beams emitted from one facet of a laser diode by imaging the multiple beams onto a phase conjugating reflective component, obtaining reflected phase conjugated electromagnetic radiation from the phase conjugating reflective component, providing the reflected phase conjugated electromagnetic radiation to the one facet of the laser diode; the laser diode comprising an array of semiconductor active regions disposed between the one facet and another facet, propagating at least a portion of the provided reflected phase conjugated electromagnetic radiation through the array of semiconductor active regions to the other facet, emitting, from the other facet, electromagnetic radiation resulting from the propagated at least a portion of the provided reflected phase conjugated electromagnetic radiation through the array of semiconductor active regions and providing the electromagnetic radiation emitted from the other facet to a beam combining component, thereby combining the electromagnetic radiation emitted from the other facet into substantially a single beam. In one instance, the above described embodiment of the method of these teachings for coherently combining the multiple beams emitted from the other facet also includes selecting a substantially a single longitudinal mode from the multiple beams emitted from the one facet.

Although these teachings have been described with respect to various embodiments, it should be realized that these teachings are also capable of a wide variety of further and other embodiments within the spirit and scope of the appended claims.

What is claimed is:
1. A system comprising:
 a laser diode comprising:
  an array of semiconductor active regions disposed between two at least partially transmissive facets;

an optical subsystem optically disposed to receive electromagnetic radiation emitted from one of said two partially transmissive facets; and a phase conjugating reflective component optically disposed to receive electromagnetic radiation from said optical subsystem; said optical subsystem imaging the electromagnetic radiation emitted from said one of said two partially transmissive facets onto said phase conjugating reflective component;

said phase conjugating reflective component providing phase conjugated reflected electromagnetic radiation to said optical subsystem; said optical subsystem providing at least a portion of said phase conjugated reflected electromagnetic radiation to said laser diode; and electromagnetic radiation resulting from propagation of at least a portion of the electromagnetic radiation, provided by said optical subsystem to said laser diode, through the array of semiconductor active regions being emitted by another facet from said two at least partially transmissive facets; said laser diode being an only source of said phase conjugated reflected electromagnetic radiation; the electromagnetic radiation received by said phase conjugating reflective component being coherent; said phase conjugating reflective component and another one of said two at least partially transmissive facets forming a laser resonator.

2. The system of claim 1 further comprising:
a beam combining component optically disposed to receive said at least a portion of electromagnetic radiation emitted by said another facet and capable of coherently combining beams from said at least a portion of electromagnetic radiation emitted by said another facet.

3. The system of claim 2 wherein where in said beam combining component comprises a Talbot cell.

4. The system of claim 3 wherein said Talbot cell comprises a multi-mode interference device.

5. The system of claim 2 further comprising an optical fiber optically disposed to receive electromagnetic radiation from said beam combining component.

6. The system of claim 2 wherein said beam combining component emit substantially a single beam of electromagnetic radiation.

7. The system of claim 6 further comprising another optical subsystem capable of focusing said substantially single beam of electromagnetic radiation to a spot of dimensions at most 3 times a diffraction limited spot.

8. The system of claim 6 further comprising another optical subsystem capable of receiving said substantially single beam of electromagnetic radiation and of emitting another substantially single beam of electromagnetic radiation.

9. The system of claim 8 wherein said another optical subsystem comprises optical elements, at least some of said optical elements being reflective optical elements or refractive optical elements.

10. The system of claim 1 wherein said optical subsystem comprises:
a group of optical components capable of collimating beams from said electromagnetic radiation emitted from said one of said two partially transmissive facets; and
another group of optical components capable of imaging said collimated beams onto said phase conjugating reflective component.

11. The system of claim 10 wherein said group of optical components comprises a cylindrical collimating lens; and an array of lenslets optically disposed to receive electromagnetic radiation from said cylindrical collimating lens.

12. The system of claim 11 wherein said optical subsystem further comprises a frequency selecting component, transmission of electromagnetic radiation through said frequency selecting component having a substantially relative maximum at a plurality of predetermined frequencies; said frequency selecting component being optically disposed to receive collimated beams from said group of optical components and to provide electromagnetic radiation to said another group of optical components.

13. The system of claim 12 wherein said frequency selecting component comprises a component selected from a Fabry Perot etalon and a diffraction grating.

14. The system of claim 1 wherein said one facet comprises an antireflection coating, said antireflection coating substantially minimizing reflections at about a laser wavelength.

15. The system of claim 1 wherein said phase conjugating reflective component comprises an optical glass fiber having a predetermined core diameter and a predetermined length.

16. The system of claim 1 wherein said phase conjugating reflective component comprises a component selected from a two-wave mixing, stimulated Brillouin scattering component, a two-wave mixing, stimulated Raman scattering component, or a two-wave mixing, photorefractive component.

17. A method for improving phase characteristics of multiple beams emitted from one facet of a laser diode, the method comprising the steps of:
imaging the multiple beams onto a phase conjugating reflective component;
obtaining reflected phase conjugated electromagnetic radiation from the phase conjugating reflective component; the laser diode being an only source of the phase conjugated reflected electromagnetic radiation; the electromagnetic radiation received by said phase conjugating reflective component being coherent;
providing the reflected phase conjugated electromagnetic radiation to said one facet of the laser diode; the laser diode comprising an array of semiconductor active regions disposed between said one facet and another facet; said phase conjugating reflective component and said another facet forming a laser resonator;
propagating at least a portion of the provided reflected phase conjugated electromagnetic radiation through the array of semiconductor active regions to said another facet; and
emitting, from said another facet, electromagnetic radiation resulting from said propagated at least a portion of the provided reflected phase conjugated electromagnetic radiation through the array of semiconductor active regions.

18. The method of claim 17 further comprising the step of:
selecting substantially a single longitudinal mode from the multiple beams emitted from said one facet.

19. A method for coherently combining multiple beams emitted from one facet of a laser diode, the method comprising the steps of:
imaging the multiple beams onto a phase conjugating reflective component; the laser diode being an only source of the emitted multiple beams,
obtaining reflected phase conjugated electromagnetic radiation from the phase conjugating reflective component; the laser diode being an only source of said phase conjugated reflected electromagnetic radiation; the electromagnetic radiation received by said phase conjugating reflective component being coherent; said phase conjugating reflective component and another facet of the laser diode forming a laser resonator;

providing the reflected phase conjugated electromagnetic radiation to said one facet of the laser diode; the laser diode comprising an array of semiconductor active regions disposed between said one facet and another facet;

propagating at least a portion of the provided reflected phase conjugated electromagnetic radiation through the array of semiconductor active regions to said another facet;

emitting, from said another facet, electromagnetic radiation resulting from said propagated at least a portion of the provided reflected phase conjugated electromagnetic radiation through the array of semiconductor active regions; and combining the electromagnetic radiation emitted from the other facet into substantially a single beam.

20. The method of claim 19 further comprising the step of:
selecting substantially a single longitudinal mode from the multiple beams emitted from said another facet.

21. A laser comprising:
an optical active medium; and
an optical pumping component providing electromagnetic radiation to said optical gain medium, said optical pumping component comprising:
a laser diode comprising:
an array of semiconductor active regions disposed between two at least partially transmissive facets;
an optical subsystem optically disposed to receive electromagnetic radiation emitted from one of said two partially transmissive facets; said laser diode being an only source of emitted electromagnetic radiation in the laser;
a phase conjugating reflective component optically disposed to receive electromagnetic radiation from said optical subsystem; said optical subsystem imaging the electromagnetic radiation emitted from said one of said two partially transmissive facets onto said phase conjugating reflective component;
said phase conjugating reflective component providing phase conjugated reflected electromagnetic radiation to said optical subsystem; said optical subsystem providing at least a portion of said phase conjugated reflected electromagnetic radiation to said laser diode; said laser diode being an only source of said phase conjugated reflected electromagnetic radiation; the electromagnetic radiation received by said phase conjugating reflective component being coherent; said phase conjugating reflective component and another one of said two at least partially transmissive facets forming a laser resonator;
electromagnetic radiation resulting from propagation of at least a portion of the electromagnetic radiation, provided by said optical subsystem to said laser diode, through the array of semiconductor active regions being emitted by another facet from said two at least partially transmissive facets; and
a beam combining component optically disposed to receive said at least a portion of electromagnetic radiation emitted by said another facet and capable of coherently combining beams from said at least a portion of electromagnetic radiation emitted by said another facet.

22. The laser of claim 21 wherein said optical subsystem comprises:
a group of optical components capable of collimating beams from said electromagnetic radiation emitted from said one of said two partially transmissive facets; said group of optical components comprising a cylindrical collimating lens; and an array of lens-lets optically disposed to receive electromagnetic radiation from said cylindrical collimating lens;

a frequency selecting component, transmission of electromagnetic radiation through said frequency selecting component having a substantially relative maximum at a plurality of predetermined frequencies; said frequency selecting component being optically disposed to receive collimated beams from said group of optical components and to provide electromagnetic radiation to another group of optical components; and said another group of optical components capable of imaging said collimated beams onto said phase conjugating reflective component.

23. The system of claim 21 wherein said optical active medium is a laser gain medium, an optical medium capable of parametric amplification or an optical medium capable of harmonic generation.

24. A system comprising:
at least two coherently combining subsystems, each one of said at least two coherently combining subsystems comprising:
a laser diode comprising:
an array of semiconductor active regions disposed between two at least partially transmissive facets;
an optical subsystem optically disposed to receive electromagnetic radiation emitted from one of said two partially transmissive facets; said laser diode being an only source of emitted electromagnetic radiation in the system;
a phase conjugating reflective component optically disposed to receive electromagnetic radiation from said optical subsystem; said optical subsystem imaging the electromagnetic radiation emitted from said one of said two partially transmissive facets onto said phase conjugating reflective component;
said phase conjugating reflective component providing phase conjugated reflected electromagnetic radiation to said optical subsystem; said optical subsystem providing at least a portion of said phase conjugated reflected electromagnetic radiation to said laser diode; said laser diode being an only source of said phase conjugated reflected electromagnetic radiation; the electromagnetic radiation received by said phase conjugating reflective component being coherent; said phase conjugating reflective component and another one of said two at least partially transmissive facets forming a laser resonator;
electromagnetic radiation resulting from propagation of at least a portion of the electromagnetic radiation, provided by said optical subsystem to said laser diode, through the array of semiconductor active regions being emitted by another facet from said two at least partially transmissive facets; and
a beam combining component optically disposed to receive said at least a portion of electromagnetic radiation emitted by said another facet and capable of coherently combining beams from said at least a portion of electromagnetic radiation emitted by said another facet; and
another beam combining component optically disposed to receive electromagnetic radiation from each one of said at least two coherently combining subsystems.

25. The system of claim 24 further comprising:
at least two optically deflecting components; one of said at least two optically deflecting components optically disposed to receive electromagnetic radiation from one of said at least two coherently combining subsystems and capable of deflecting received electromagnetic radiation to a predetermined location; another one of said at least two optically deflecting components optically disposed to receive electromagnetic radiation from another one of said at least two coherently combining subsystems and capable of deflecting received electromagnetic radiation to another predetermined location;

another optically deflecting component; said another optically deflecting component capable of receiving electromagnetic radiation at said predetermined location from said one of said at least two optically deflecting components, of receiving electromagnetic radiation at said another predetermined location from said another one of said at least two optically deflecting components and of providing received electromagnetic radiation to said another beam combining component.

26. The system of claim 1 wherein said phase conjugating reflective component comprises a component selected from a four-wave mixing, stimulated Brillouin component, a four-wave mixing, stimulated Raman scattering component, or a four-wave mixing, photorefractive component.

* * * * *

UNITED STATES PATENT AND TRADEMARK OFFICE
CERTIFICATE OF CORRECTION

| | | |
|---|---|---|
| PATENT NO. | : 7,929,585 B2 | Page 1 of 1 |
| APPLICATION NO. | : 11/940741 | |
| DATED | : April 19, 2011 | |
| INVENTOR(S) | : Michael M. Tilleman | |

It is certified that error appears in the above-identified patent and that said Letters Patent is hereby corrected as shown below:

Claim 14 (Column 12, lines 13-15) – delete claim 14

Signed and Sealed this
Twenty-first Day of June, 2011

David J. Kappos
*Director of the United States Patent and Trademark Office*